United States Patent [19]

Loftness

[11] Patent Number: 4,609,866
[45] Date of Patent: Sep. 2, 1986

[54] ELECTRICAL SYSTEMS INTERFERENCE LOCATOR

[76] Inventor: Marvin O. Loftness, 115 W. 20th Ave., Olympia, Wash. 98501

[21] Appl. No.: 607,443

[22] Filed: May 7, 1984

[51] Int. Cl.⁴ ...................... G01R 31/08; H01Q 21/12
[52] U.S. Cl. .................................. 324/52; 324/57 N; 343/812; 343/878; 455/67
[58] Field of Search .................. 324/51, 52, 67, 57 N, 324/72.5, 95; 179/175.3 F; 343/812-816, 703, 810; 455/272, 67, 278, 226, 156; 340/658; 343/878

[56] References Cited

U.S. PATENT DOCUMENTS

| | | | |
|---|---|---|---|
| 3,487,415 | 12/1969 | Simons | 343/815 |
| 3,636,641 | 1/1972 | Daskam | 455/67 |
| 4,072,899 | 2/1978 | Shimp | 455/67 |

OTHER PUBLICATIONS

Stecher, VHF-UHF Test Receiver ESU 2 Becomes Field-Strength Meter and Selective Analyzer, News from Rohde & Schwartz, vol. 16, No. 73, pp. 10–13, 1976.

Primary Examiner—Reinhard J. Eisenzopf
Assistant Examiner—Jack B. Harvey
Attorney, Agent, or Firm—Olson and Olson

[57] ABSTRACT

A portable electrical systems interference detector and locator comprises a circuitry housing box which mounts a two-piece antenna having forward section formed of dielectric material and a metal aft section which mounts both a folded dipole UHF driven antenna element and an active VHF driven extendable dipole antenna element. The locator includes circuitry by which both UHF and VHF inputs are received, amplified, and delivered to a field strength meter. Audio noise and/or signal output from the meter is delivered through an audio amplifier to a speaker for use by an operator for the purpose of locating the direction of strongest noise and/or signal whereby the location of a sparking or other defect in an electrical system can be ascertained.

9 Claims, 4 Drawing Figures

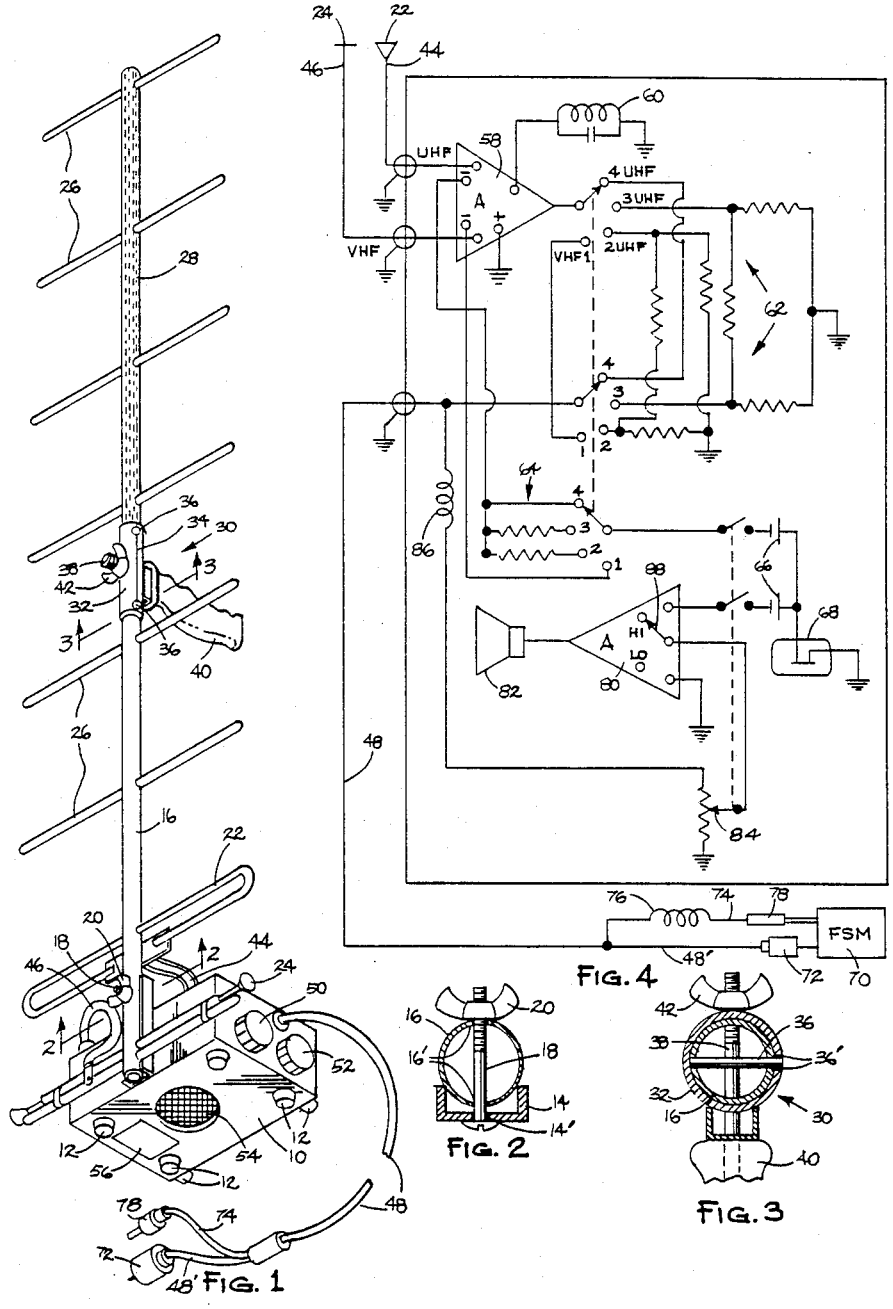

ELECTRICAL SYSTEMS INTERFERENCE LOCATOR

BACKGROUND OF THE INVENTION

This invention relates to the detection and location of electrical defects in electric power and distribution lines, and associated components and equipments, signal searching for locating suitable UHF and VHF antenna sites for CATV and communications type installations, and more particularly to a combination UHF and VHF detector for locating such defects and locations.

It is desirable, for example, for power company line crews and others to be able to locate sparking defects in power lines and associated equipment in need of repair and to confirm the effectiveness of maintenance or repair work done to correct the defects. Such defects as loose insulators, tie wires, hardware, bonding and other deficiencies associated with power lines, result in arcing or sparking, including corona discharge, which may damage electrical equipment and also produce ultra and very high frequency noise emissions. Therefore it is desirable that a locator be capable of identifying the general area of a power line defect, as well as capable of locating the specific structure within this area containing the defect.

UHF and VHF probes have been utilized heretofore for the purpose of detecting and locating such defects as has been mentioned above. However, such locators are provided only as separate VHF and UHF type units for use individually as alternative devices to perform the necessary functions.

The present invention provides a device related to the locator of the general type and class described in my earlier U.S. Pat. No. 4,439,723 but designed for ease of use from a greater distance and principally from the ground and/or in a vehicle and with an improved antenna configuration.

SUMMARY OF THE INVENTION

In its basic concept, the electrical systems defect detector and locator of this invention couples a standard, unmodified and commercially available field strength meter to a special VHF/UHF antenna through novel common circuitry resulting in a superior power line interference locator of extended capability for identifying the general area of a power line defect and for locating the specific structure within this general area containing the defect.

It is by virtue of the foregoing basic concept that the principal objective of this invention is achieved; namely, to overcome the limitations and disadvantages of electrical systems defect detectors of the prior art.

Another object of this invention is the provision of an electrical systems defect detector and locator of the class described which is highly portable, and may be easily assembled and disassembled without tools. When disassembled, the components may be carried in a small attache or other case suitable as carry-on luggage aboard aircraft.

Another object of this invention is the provision of an electrical systems defect detector and locator of the class described which uses a single antenna assembly that does not require changing for use in both VHF and UHF searching and which antenna also permits safe operation near high voltage equipment.

A further object of this invention is the provision of an electrical systems defect detector and locator of the class described which affords the user both a field strength meter and an internal sound emitting speaker for use in determining the location of sparking defects in power line equipment. A still further object of this invention is the provision of an electrical systems defect detector and locator of the class described which is of simplified construction for economical manufacture and ease of operation.

The foregoing and other objects and advantages of this invention will appear from the following detailed description, taken in connection with the accompanying drawings of a preferred embodiment.

BRIEF DESCRIPTION OF THE DRAWINGS

FIG. 1 is a perspective view of an electrical systems defect detector and locator embodying the features of this invention.

FIG. 2 is a sectional view of the antenna boom support clamp taken along the line 2—2 in FIG. 1.

FIG. 3 is a sectional view of the boom joining clamp taken along the line 3—3 in FIG. 1.

FIG. 4 is a schematic diagram of an electrical circuit for the detector and locator illustrated in FIG. 1.

DESCRIPTION OF THE PREFERRED EMBODIMENT

The locator illustrated in the drawings includes a hollow antenna chassis box 10 formed of front, rear, side, top and bottom walls. The box is preferably made of metal in order for the box to provide VHF/UHF shielding of the circuitry against outside interference from television and radio stations. The chassis box contains the circuitry of the locator as will be described later. Also, the box preferably mounts the four support feet 12 on its front wall and the two feet on the bottom wall. These feet are arranged to support and protect the box 10 when placed in alternative positions on a surface to extend the antenna vertically or horizontally and for convenience in transportation and storage.

Means is provided on the box 10 for receiving and mounting a signal receiving antenna. As best illustrated in FIGS. 1 and 2, a U-shaped antenna boom support saddle 14 is mounted centrally on the top of the antenna chassis box 10, and is arranged to receive the aft section 16 of an antenna boom to align it properly with the box, and to firmly and removably support the antenna assembly by means of its boom section 16.

The U-shaped support saddle 14 receives the aft end section 16 of the antenna boom between the projecting flanges of the saddle. A bolt 18 extends through bores 16' in the antenna section 16, as shown best in FIG. 2. The head end of the bolt is received removably in a slot 14' in the forward end of the saddle, and a wing nut 20 is threaded onto the opposite end of the bolt to releasably clamp the antenna section in positive engagement with the saddle.

The aft section 16 is a metal boom which mounts an active UHF driven folded dipole antenna element 22 of the yagi type which is broad banded to the extent required for the locating procedures. The folded dipole also provides a balanced input to the preamplifier. This improves the directivity of the antenna. The aft portion of the antenna also mounts an active VHF driven extendable dipole antenna element 24 which also acts as a reflector for the UHF element. Metal director elements 26 are also mounted at spaced intervals along the length of the antenna section 16.

The antenna also includes a passive forward antenna section 28 formed of fiberglass or other dielectric material which permits safe operation near certain types of high voltage equipment. The metal directors 26 continue along the forward section 28 of the antenna as with antenna section 16.

Means is provided for releasably connecting and aligning the aft and forward antenna sections 16 and 28 together. As illustrated in FIGS. 1 and 2, an antenna joining clamp 30 comprises a cylindrical tube 32 provided with a single longitudinally extending slot 34 along one side thereof. The antenna sections 16 and 28 mount, adjacent their confronting ends, outwardly projecting alignment pins 36 (FIGS. 1 and 3) arranged to be captured by alignment notches 36' communicating with the slot 34 adjacent the opposite ends thereof when the respective antenna section is inserted into the clamp tube 32. In this manner, the antenna sections 16 and 28 are aligned relative to each other with the directors 26 arranged in a common plane. The notches 36' also serve to prevent inadvertent longitudinal separation of the boom sections 16 and 28.

A bore (not shown) is provided centrally through the tube 32, normal to the slot 34, to receive a clamping bolt 38. The bolt is mounted upon and extends from the inner end of an aiming handle member 40, preferably of pistol grip shape. The opposite end of the bolt extends from the tube 32 and receives a tightening nut 42. Turning the tightening nut 42 compresses the slotted tube 32 over the antenna section 16 and 28 and thereby clamps them firmly together in longitudinal extension relative to each other, as illustrated. The antenna sections are thus also easily separable in the reverse manner.

Returning briefly to the chassis box 10, shown in FIG. 1, a twin lead UHF dipole antenna cable 44 is illustrated connecting the UHF element 22 to the electronic circuitry in the box. Also, a VHF coaxial antenna cable 46 is shown connecting the VHF extendable dipole element 24 through an "F" fitting to the electronic circuitry. Additionally, a special multiplexing cable 48 extends from one side wall of the box 10 for connection to a field strength meter, as will be discussed later. The side wall of the box also mounts external control knob 50 and 52 for controlling volume and gain, respectively, also discussed later. A speaker opening 54 and a battery access cover 56 are provided on the rear wall of the box.

Referring now to FIG. 4 of the drawings, the electronic circuitry of the locator is shown schematically. Antenna input leads 44 and 46 connect to a high overload type RF preamplifier 58 which amplifies both UHF and VHF noise and signals. The high overload type of preamplifier is desirable because high level television signals can be present in the area, and could overload the amplifier and cause noise and interference itself. An FM trap 60 is included in the preamplifier 58 to greatly reduce FM broadcast signals which could interfere with the operation of the locator as well.

The ouput noise or signals from the preamplifier are fed to an RF attenuator 62 which is illustrated herein as fixed resistors connected through ganged switches to cable 48. The ganged switches are also ganged to a switch which connects the resistors of a current limiter control 64 to amplifier battery supply 66. The current limiter lowers the voltage applied to the preamplifier from battery 66 at the same time that the RF attentuation is increased. This permits a substantial reduction in battery drain when high sensitivity is not required. The RF attenuator section 62, in combination with the current limiter section 64, forms the gain control, operated externally by knob 52, which also acts as a battery saver control.

As an additional battery saving feature, a mercury switch 68 opens the battery circuit when the unit is carried in nonoperating positions (with the antenna pointing downward).

From the gain control section, RF noise and/or signals are directed to a field strength meter 70 through the special multiplexing cable 48. This cable is of the coaxial type, and splits into two leads near its outer terminal end adjacent its connection to the field strength meter. One lead 48' has an "F" connector 72 for connection to the RF input of the meter. The other lead 74 includes a combiner/splitter (multiplexer) 76 which combines or splits the audio and RF information traversing the coaxial cable. This lead terminates in a phone type plug 78 for connection to either the phone jack or video jack of a field strength meter.

Finally, an audio circuit in the locator comprises an audio amplifier 80, a speaker 82 and/or a head phone jack (not shown), and a volume control/on-off switch 84. Audio output returns from the field strength meter through the coaxial cable 48 and passes through another combiner/splitter (multiplexer) 86 to the audio amplifier and from there to the speaker as noise and/or signals which the operater can hear. The input high/low switch 88 illustrated is operated only to adapt the unit to the particular field strength meter being used. For example, if a field strength meter with a low level output video jack is used the input switch 88 is switched to low position to provide much more amplification. Alternatively, this switching may be accomplished by use of a jumper.

With the antenna boom section 16 mounted on the housing box 10 and all antenna connections to the box having been made, and with a field strength meter connected to the locator by the coaxial cable 48, a typical operation of the locator is as follows: Assuming that the VHF locating step is required, the field strength meter is tuned to 200 MHz, and the extendable dipole VHF antenna 26 also is tuned for 200 MHz, i.e. extended to the correct length for that frequency. The operator then may drive his vehicle along a power line directing the antenna towards the poles and wires, using only the aft end 16 of the antenna if desired. When power line noise is heard, the operator will decrease gain as much as is possible to narrow the search down to three or four poles. It may then be observed that only a very little difference in noise level can be detected between these poles. This means that the group of poles have been located and the search begins using the UHF mode.

For the UHF locating step, the extendable dipole element is retracted to its miminum length, and the field strength meter is tuned to 500 MHz. The operator, with the antenna now fully assembled, walks along the group of poles having the suspected defect. The locator is tuned to maximum gain and maximum volume, but immedately upon picking up noise, the operator reduces both the gain and the volume to a moderately low level. He then proceeds in the direction that the noise level increases, pointing the antenna toward or along the power line. As the noise level increases, the operator reduces the gain and volume until a pole is passed where the noise level starts dropping of its own accord. The direction then is reversed to narrow the search. The boundary limits containing the noise defect have thus been determined, and this procedure is repeated with progressively decreasing gain and volume settings until the search has been narrowed down to a particular pole or area.

From the foregoing it will be noted that searching in the UHF mode is accomplished by simply reducing gain and volume, without need of making antenna changes, and without need of changing UHF frequencies. Also, once the field strength meter is tuned to either VHF or UHF all adjustments during the locating procedure are made at the antenna chassis box. Here all adjustments needed involve only two controls, and the result is that the locating procedure is uncomplicated.

From the foregoing detailed description it will be apparent that various changes may be made in the size, shape, type, number and arrangement of parts described herein. For example, the speaker and audio amplifier may be provided as an integral part of the field strength meter. It is preferred, however, that they be located in the chassis box 10 since the latter is positioned closely adjacent the ear of the operator. Additionally, the frequencies exemplified are typical only and may be raised or lowered within the VHF or UHF spectrums as desired. These and other changes may be made without departing from the spirit of this invention and the scope of the appended claims.

Having thus described my invention and the manner in which it may be used, I claim:

1. In an electrical systems interference locator in which UHF and VHF noise and/or signals are detected and their sources located, the combination therewith of an antenna including an aft boom section of electrically conductive material having front and rear ends and a forward boom section of electrically non-conductive material having front and rear ends, a UHF driven element and a VHF driven element mounted adjacent the rear end of the aft boom section, a plurality of director elements mounted at spaced intervals along the length of the aft and forward boom sections, and coupler means for releasably connecting the front end of the aft boom section and the rear end of the forward boom section together in longitudinal extension.

2. The antenna of claim 1 including alignment means on the coupler means and antenna boom sections for orienting the director elements on said boom sections in a common plane.

3. The antenna of claim 1 wherein the coupler means includes a handle member for manual manipulation of the antenna.

4. The antenna of claim 1 wherein the coupler means includes a hollow, longitudinally split tube arranged to receive the adjacent ends of the boom sections in the opposite ends thereof, and clamp means on the tube for reducing the circumferential dimension of the split therein, for releasably clamping the tube around the boom sections.

5. The antenna of claim 4 wherein the clamp means comprises a bolt extending diametrically through the tube substantially perpendicular to the split in the tube.

6. The antenna of claim 4 including alignment pins on the antenna boom sections and alignment notches in the tube adjacent the split therein arranged to receive the alignment pins for orientating the director elements on said boom sections in a common plane.

7. An electrical systems interference locator, comprising:
 (a) an antenna including a UHF driven element and a VHF driven element,
 (b) RF preamplifier means having an input connected to both UHF and VHF driven elements for amplifying the noise and/or signals received thereby, and an output connected to RF attenuator means,
 (c) a field strength meter having an RF input and an audio frequency output,
 (d) means for coupling the output of the RF attenuator means to the RF input of the field strength meter,
 (e) audio amplifier means having an output connected to a speaker, and
 (f) means for coupling the audio output of the field strength meter to the input of the audio amplifier means.

8. The electrical systems interference locator of claim 7 wherein the means for coupling the output of the RF attenuator means to the input of the field strength meter and the means for coupling the audio output of the field strength meter to the input of the audio amplifier means includes a single coaxial cable interconnecting the RF attenuator means and the RF input of the meter, multiplexer means connecting the audio output of the meter to the single coaxial cable, and multiplexer means connecting the single coaxial cable to the audio amplifier means.

9. The electrical systems interference locator of claim 7 including a battery supply for the RF preamplifier means, means for adjusting the RF attenuator means for increasing and decreasing the latter, voltage regulating means connecting the battery supply to the RF preamplifier means, means for adjusting the voltage regulating means for increasing and decreasing the voltage to the RF preamplifier means, and means interconnecting the adjusting means for the RF attenuator means and voltage regulating means for lowering the voltage to the RF preamplifier means as the RF attenuation is increased.

* * * * *